(12) United States Patent
Rao et al.

(10) Patent No.: US 8,044,724 B2
(45) Date of Patent: Oct. 25, 2011

(54) LOW JITTER LARGE FREQUENCY TUNING LC PLL FOR MULTI-SPEED CLOCKING APPLICATIONS

(75) Inventors: Chethan Rao, San Jose, CA (US); Alvin Wang, Saratoga, CA (US); Shaishav Desai, Sunnyvale, CA (US)

(73) Assignee: MoSys, Inc., Santa Clara, CA (US)

( * ) Notice: Subject to any disclaimer, the term of this patent is extended or adjusted under 35 U.S.C. 154(b) by 15 days.

(21) Appl. No.: 12/430,430

(22) Filed: Apr. 27, 2009

(65) Prior Publication Data

US 2010/0073051 A1 Mar. 25, 2010

Related U.S. Application Data

(60) Provisional application No. 61/192,847, filed on Sep. 22, 2008.

(51) Int. Cl.
*H03L 7/00* (2006.01)
(52) U.S. Cl. .................. 331/17; 331/8; 331/16; 331/25
(58) Field of Classification Search .............. 331/16, 331/17, 8, 25
See application file for complete search history.

(56) References Cited

U.S. PATENT DOCUMENTS

| 6,326,852 | B1 * | 12/2001 | Wakayama | 331/17 |
|---|---|---|---|---|
| 6,441,660 | B1 * | 8/2002 | Ingino, Jr. | 327/156 |
| 7,079,616 | B2 * | 7/2006 | Castiglione et al. | 375/376 |
| 7,135,934 | B2 * | 11/2006 | Sanchez et al. | 331/18 |
| 7,408,419 | B2 * | 8/2008 | Ko | 331/17 |
| 7,554,416 | B2 * | 6/2009 | Lee et al. | 331/115 |
| 2002/0039050 | A1 * | 4/2002 | Griffith et al. | 331/17 |
| 2003/0016088 | A1 * | 1/2003 | Scheffler | 331/100 |
| 2006/0284689 | A1 * | 12/2006 | Gomez | 331/16 |
| 2008/0007365 | A1 * | 1/2008 | Venuti et al. | 331/179 |

\* cited by examiner

*Primary Examiner* — Joseph Chang
*Assistant Examiner* — Jeffrey Shin
(74) *Attorney, Agent, or Firm* — Bever, Hoffman & Harms, LLP; E. Eric Hoffman

(57) ABSTRACT

The subject innovation relates to systems and/or methodologies for generating a low jitter large frequency tuning LC-based phase-locked loop circuit for multi-speed clocking applications. In addition to a plurality of noise reduction features, the phase-locked loop includes programmable charge pump and loop filter that enable a wide loop bandwidth, a programmable VCO that enables a wide VCO frequency range and a per lane clock divider that further enables a wide PLL frequency range. Furthermore, an auto-calibration circuit ensures that the VCO included in the PLL receives the optimum current for noise reduction across the VCO frequency range.

10 Claims, 20 Drawing Sheets ed with an aspect of the subject specification;

LOW JITTER LARGE FREQUENCY TUNING LC PLL FOR MULTI-SPEED CLOCKING APPLICATIONS

CLAIM OF PRIORITY UNDER 35 U.S.C. §119

The present Application for Patent claims priority to Provisional Application No. 61/192,847 entitled "A low jitter large frequency tuning LC PLL in CMOS for multi-GHz clocking applications" filed Sep. 22, 2008, and assigned to the assignee hereof and hereby expressly incorporated by reference herein.

BACKGROUND

1. Field

The present innovation relates generally to an LC phase-locked loop (PLL), and more specifically to improving the LC PLL's jitter performance, loop bandwidth, voltage control oscillator (VCO) frequency range and the PLL frequency range for multi-speed clocking applications.

2. Background

A phase-locked loop is a well known circuit that is typically used as a control system to generate a signal having a fixed relation to the phase of a reference signal. With reference to FIG. 1, a typical phase-locked loop is shown. The phase-locked loop 100 includes a phase detector 102, a voltage controlled oscillator (VCO) 104, and a feedback 106 path from the VCO 104 to the phase detector 102. The phase detector 102 receives as inputs a reference signal and a feedback signal from the VCO 104. The phase detector output controls the VCO 104 such that the phase difference between the two inputs is held constant. The VCO 104 generates an output frequency based on the output of the phase detector. Voltage controlled oscillators 104 are an integral part of high speed serial interfaces, and the performance of the VCO 104 to a large extent can determine the performance of the PLL 100 as a whole.

With the ever increasing data rates and density of high speed serial interfaces in transmission systems, current Serializer-Deserializer (SerDes) transceivers need to be multi-data rate compatible to support new link speeds and standards while still being compatible with previous speeds and standards. Achieving the desirable higher data rates with older lossy and discontinuous channels places a large burden on silicon, particularly in equalization and clocking. As a consequence, it is desirable to have a low jitter phase-locked loop (PLL) that provides a tolerance in the transmit path jitter budget and also facilitates reliable data recovery by the clock and data recovery (CDR) delay-locked loop (DLL) and phase interpolator (PI) in the receiver.

Typically, when circuit designers attempt to satisfy the requirements of multiple standards with one PLL design, they use a ring-oscillator PLL. The inherent properties of ring-oscillator PLLs give them wide-bandwidth capabilities. However, ring-oscillator PLLs also traditionally suffer from poor jitter performance. Compared to the ring-oscillator PLLs, LC PLLs generally have superior jitter performance but a smaller VCO frequency range. It would be desirable to have a PLL solution with the jitter performance of a LC PLL and the wide-band performance of a ring-oscillator PLL.

SUMMARY

The following presents a simplified summary of one or more aspects of the present invention in order to provide a basic understanding of the present invention. This summary is not an extensive overview of all contemplated aspects, and is not intended to identify all the key or critical elements of all aspects of the present invention or to delineate the scope of any or all aspects of the present invention. Its sole purpose is to present some concepts of one or more aspects of the present invention in a simplified form as a prelude to the more detailed description that is presented later.

[Inserted Upon Claim Approval]

To accomplish the foregoing and related ends, the one or more aspects of the present invention comprise the features hereinafter fully described and particularly pointed out in the claims. The following description and the annexed drawings set forth in detail certain illustrative features of the one or more aspects of the present invention. These features are indicative, however, of but a few of the various ways in which the principles of present invention may be employed, and this description is intended to include all the aspects of the present invention and their equivalents.

DETAILED DESCRIPTION

Figure 1:
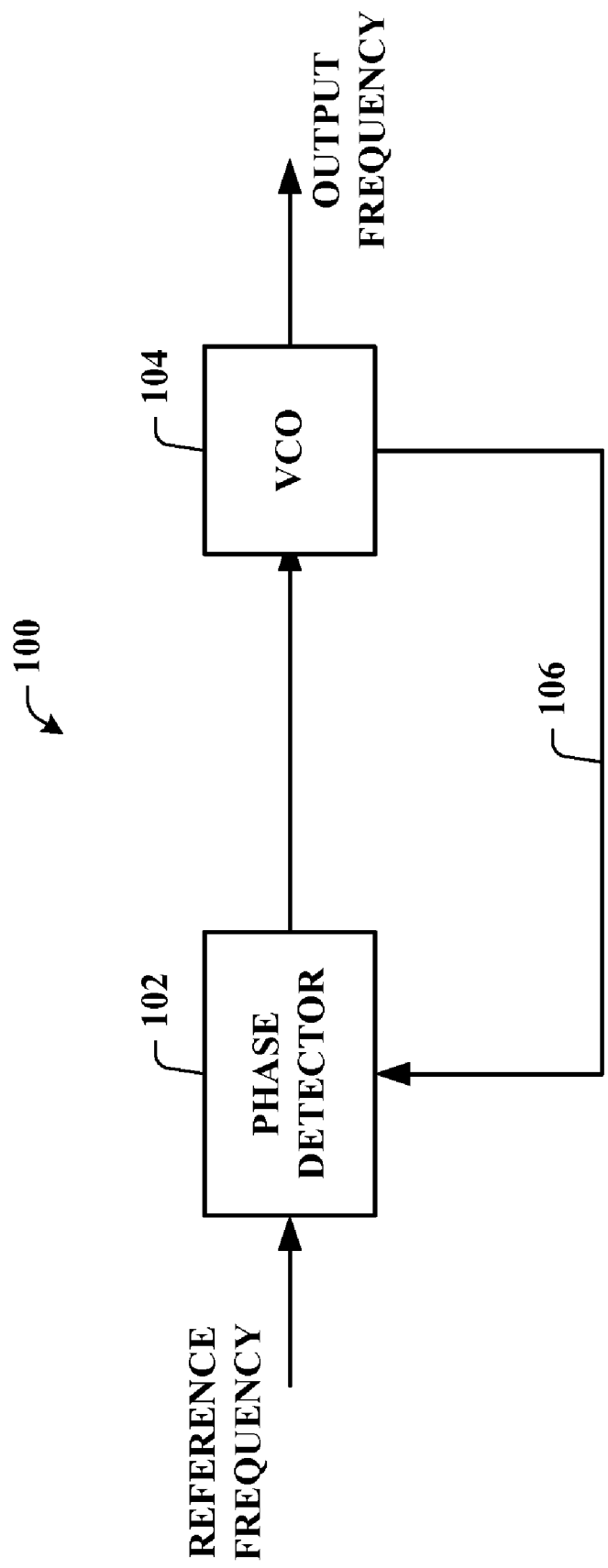
FIG. 1 illustrates a general component block diagram of a phase-locked loop.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

Figure 2:
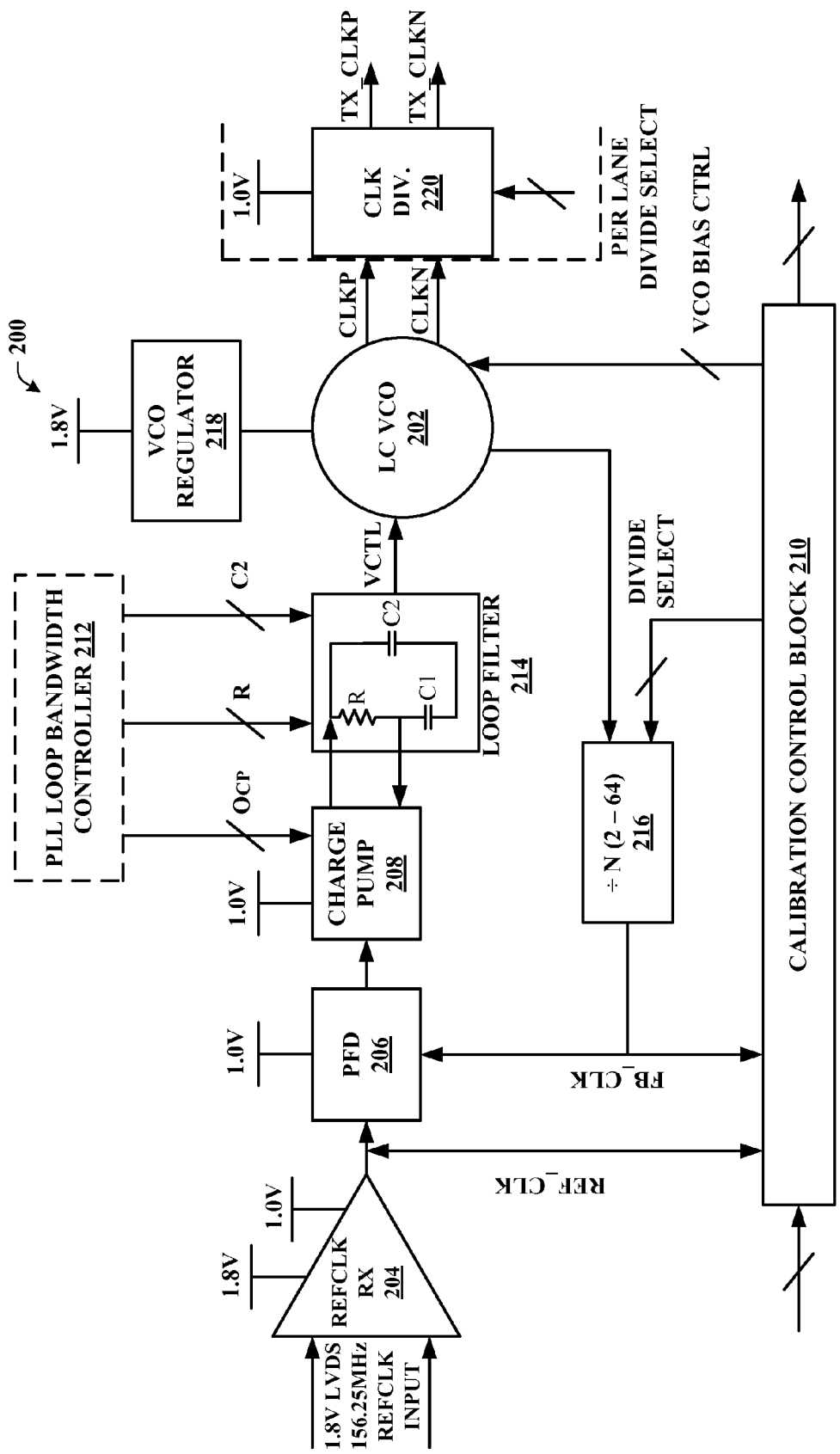
FIG. 2 is a general component block diagram of a low-jitter large frequency tuning LC phase-locked loop circuit in accordance with an aspect of the subject specification.

FIG. 2 is an example functional block diagram of a low-jitter large frequency tuning LC phase-locked loop circuit that can be used for multi-speed clocking applications in accordance with an aspect of the present innovation. The phase-locked loop (PLL) 200 provides an output frequency that can be used for a plurality of applications. The PLL can be used to generate stable frequencies, recover a signal from a noisy communication channel, or distribute clock timing pulses in digital logic circuits. A voltage controlled oscillator (VCO) 202 is central to the design of a PLL 200, because the VCO 202, to a large extent, determines the performance of the PLL 200 (discussed below). An approach of the present invention is to use a traditional second order passive loop filter 214 and a charge pump 208 combined with sufficient digital control circuitry to make the PLL 200 programmable and adaptable to satisfy a plurality of loop bandwidth (LBW) and peaking requirements.

Beginning on the left side of FIG. 2, a reference clock receiver (e.g., Refclk Rx) 204 obtains, acquires, or otherwise receives a reference clock signal. The reference clock receiver 204 can be, for example, a 1.8V low-voltage differential signaling (LVDS) reference clock receiver having a maximum operating frequency of 5.2 GHz. The reference clock signal can have a frequency of, for example, 156.25 MHz. The reference clock receiver supplies an input signal to a phase frequency detector (PFD) 206 based on the frequency of the reference clock input. In addition, the PFD 206 receives a feedback signal (e.g., FB_CLK) from the LC VCO 202. The PFD 206 compares the frequencies of the input signal and the feedback signal, and produces an error signal proportional to the difference of the two signals.

The error signal is provided to a programmable charge pump 208. The charge pump 208 is an electronic circuit that uses capacitors as energy storage elements to create an adjustable voltage power source. The charge pump 208 is programmable because it can contain a plurality of individual charge pumps, and the number of charge pumps that are active at a given time can be determined, selected, or otherwise programmed. For example, the charge pump 208 can contain four individual charge pumps, wherein a designer can activate a desired number of the charge pumps (e.g., one to four) via an external PLL loop bandwidth controller 212, which can be implemented in hardware, software or firmware. The controller 212 can be implemented as a portion of the calibration control block 210 module or can be a separate module.

The charge pump 208 supplies an output voltage signal to a loop filter 214. The loop filter 214 removes unwanted high frequency components from the voltage signal that are not removed by the phase frequency detector 206 so that they are not transmitted to the VCO input line (i.e. tune line). Loop filters are generally constructed by using operational amplifiers (op-amps). A disadvantage of the op-amps is that they can inject additional noise into the PLL 200. In the preferred embodiment of present invention, the loop filter 214 is constructed of passive elements to reduce the overall noise.

As illustrated in FIG. 2, there is a feedback loop between the charge pump 208 and the loop filter 214. This feedback loop functions to reduce the deterministic jitter (DJ) and thus further decreases the overall noise in the PLL 200. The loop filter 214 is programmable via a set of resistors, R, and a set of capacitors, C2, wherein the designer can select the number of active resistors R and capacitors C2 via the controller 212 (see FIG. 7). The programmability of the charge pump 208 and RC loop filter 214 enables tweaking of the PLL's 200 bandwidth properties. By programming the charge pump 208 and loop filter 214 independently, the designer can program the PLL 200 bandwidth. For example, the programmability incorporated in the charge pump 208 and loop filter 214 allows the PLL 200 to achieve a loop bandwidth (LBW) operating range of 1.6 to 9 MHz across the LC VCO 202 frequency range. Loop bandwidth (LBW) is an important performance parameter of a PLL circuit. Generally, a higher LBW is preferable to a lower LBW because the higher LBW enables the PLL to better track the reference frequency. However, conventional PLLs with high LBW cannot reliably block the jitter caused by the reference frequency, which is undesirable. The present invention provides a PLL with a high LBW and a superior jitter performance.

The loop filter 214 outputs a control voltage VCTL signal, which serves as the input voltage for the LC VCO 202. The LC VCO 202 produces an output signal (CLKP or CLKN) having a frequency based on the control voltage signal VCTL obtained from loop filter 214. The output signal is also supplied to the feedback loop having a feedback divider 216. The feedback divider 216 can divide the frequency of the feedback signal received from the LC VCO 202 by N and provide the signal having the new frequency (FB_CLK) to the PFD block 208, where N can be an integer ranging from, for example, two (2) to sixty four (64) in increments of one (1). The purpose of the division is to enable the PFD 206 to compare the FB_CLK signal with the reference frequency signal provided by the reference frequency clock receiver 204. For example, if signal provided by the reference frequency clock receiver has a frequency of 156.25 MHz and the signal output by the LC VCO 202 has a frequency of 5 GHz, the feedback driver 216 can divide frequency of the LC VCO 202 output signal by 32 and provide the new signal having a frequency of 156.25 MHz (FB_CLK) to the PFD 206. The calibration control block 210 can be programmed to determine the value of N and provide that value N to the feedback divider 216 by way of the DIVIDE/SELECT channel.

The LC VCO 202 receives 1.8V from an external power supply. Typically, power supplies can be a significant source of noise in electronic circuits, which can be particularly disruptive to the performance of the LC VCO 202. A VCO regulator 218 is provided to mitigate the effects of supply noise from the 1.8V supply. In the preferred embodiment of the present invention, the PLL 200 has a VCO frequency range of 2.343 GHz to 5 GHz using a 156.25 MHz reference clock.

The PLL 200 can also include a programmable clock divider 220 at the transmission (Tx) input of each lane (e.g., TX_CLKP, TX_CLKN), wherein the clock divider 220 can divide the frequency by an integer M, where M includes 1, 2, 4, or 8 (discussed below). The clock divider 220 enables the designer to further extend the PLL frequency range from 292.875 MHz (2.343 GHz÷8) to 5 GHz. The value of the integer M can be selected by the calibration control block 210 and provided to the clock divider 220 by way of the PER LANE DIVIDE SELECT channel. One of ordinary skill in the art can appreciate that the clock dividers 220 for the various lanes can use different values of the integer M such that each lane can transmit a clock signal having a difference frequency from the other lanes.

Figure 3:
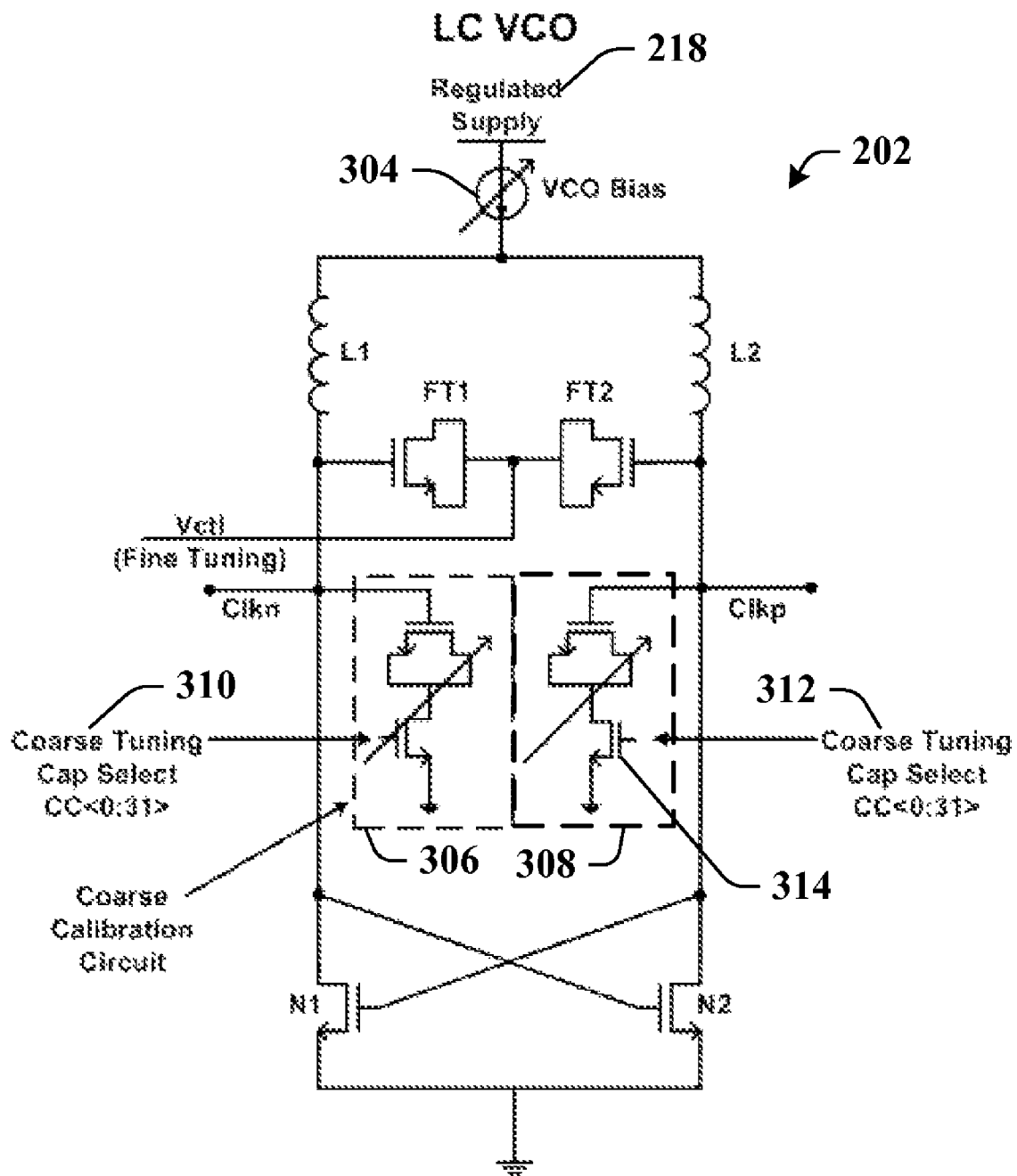
FIG. 3 is an example top level circuit diagram illustrating a differential LC tank in accordance with an aspect of the subject specification.

Turning now to FIG. 3, an example top level circuit diagram illustrating a differential LC tank circuit in accordance with an aspect of the subject innovation is shown. A regulator 218 (e.g., regulated supply) is used to isolate supply noise from leaking into the VCO 202. A programmable VCO bias current source 304 is shown, wherein the VCO bias 304 can be controlled via the calibration control block 210 shown in FIG. 2. A PMOS cascade current source can be selected as the current source 304 for the VCO 202 because it has lower inverse frequency (1/f) noise than a NMOS source for a given bias current, and therefore improves noise rejection.

The VCO bias 304 is shown coupled to the LC tank (e.g., LC VCO) 202. The LC tank 202 is designed to have a relatively low average sensitivity (KVCO) of approximately 600 MHz/V to minimize the deterministic jitter and varactor amplitude modulation to phase modulation (AM-to-PM) conversion caused due to the low frequency bias noise. The LC tank 202 uses 1.8V NMOS in Nwell accumulation-mode varactors (e.g., FT1 and FT2) and high-Q spiral inductors (e.g., L1 and L2). The Vctl (e.g., fine tuning) obtained from the loop filter discussed below with respect to FIG. 6 controls the varactors FT1 and FT2. In order to improve substrate noise rejection double guard rings are used on the varactors FT1 and FT2 and NMOS switching transistors (e.g., N1 and N2) are used as switches.

The LC tank 202 further includes a first coarse tuning calibration circuit 306 and a second coarse tuning calibration circuit 308. The coarse tuning calibration circuits 306 and 308 include a first coarse tuning cap select 310 and a second coarse tuning cap select 312, respectively. The coarse tuning cap select can activate one or more of 32 capacitors (e.g., CC<0:31>) on either side of the differential pair by opening or closing the coarse tuning transistors 314.

As discussed previously, the coarse tuning cap select can be controlled by the calibration logic (e.g., calibration control block 210). As the calibration logic alters the number of active capacitors, it also adjusts the current via the VCO bias 304. For example, the current can be adjusted within the range of 3 mA to 10 mA. The control logic is preprogrammed to adjust the VCO bias 304 for low noise at each desired frequency.

In view of the example systems described supra, the disclosed subject matter will be better appreciated with reference to FIGS. 4-13 illustrating an embodiment of the innovation as actually fabricated by the inventors thereof. The figures illustrate various parts and components of the previously disclosed system in detail, however it is to be appreciated that this is but one embodiment, and those skilled in the art may be able to readily identify equivalent embodiments within the scope and spirit of the current specification. Furthermore, the innovation described herein can additionally, or alternatively, be constructed using hardware, software, field programmable gate arrays (FPGA), and so forth.

In an embodiment of invention fabricated by the inventors, using a 156.25 MHz clock, the PLL lock was verified at 2.343 GHz, 2.5 GHz, . . . , 4.843 GHz and 5 GHz (i.e. st $f_{vco}$=156.25 MHz*X, where X=15, 16, . . . , 31, 32). The rms random jitter ($RJ_{rms}$) of the PLL was measured to be 460 fs at 5 GHz (10 Gb/s), 548 fs at 3.125 GHz and less than 750 fs across the entire VCO frequency range while the total power consumed from the 1.8V and 1.0V power supply was of the order of 32 mW. Moreover, using the figure of merit (FOM): $\{(f_{vco,max}-f_{vco,min})/f_{vco,avg}\}*100\}$, the LC VCO was found to have a coarse tuning range of 66% and a worst-case hold range (fine tuning range at minimum VCO frequency) of 9.6%. These findings are illustrated by Table 1 below:

| Table of Measured Performance | |
| --- | --- |
| Technology | 65 nm CMOS 10-metal copper/low-κ |
| Supply Voltage | 1.0 V (core), 1.8 V (I/O) |
| Input Reference Clock | 156.25 MHz |
| VCO Frequency Range | |
| Coarse Calibration Range | 2.3 to 4.6 GHz, or 66% |
| Fine tuning Range | 9.6% (minimum), 17.3% (maximum) |
| Phase Noise at 1 MHz offset | |
| Closed Loop Phase Noise: 3.125 GHz | −117.18 dBc/Hz |
| Closed Loop Phase Noise: 5 GHz | −109.31 dBc/Hz |
| Output Jitter | |
| $RJ_{rms}$: 3.125 GHz | 548 fs |
| $RJ_{rms}$: 5 GHz | 460 fs |
| Loop Bandwidth | |
| Programmable Range | 1.6 to 9 MHz |
| Peaking | 1.6 dB maximum |
| Feedback Divider | 2 to 64 in increments of 1 |
| Silicon Area | 0.35 mm² (500 um × 700 um) |
| Power | 32 mW at 5 GHz (1.0 V, 1.8 V, 25° C.) |

Figure 4:
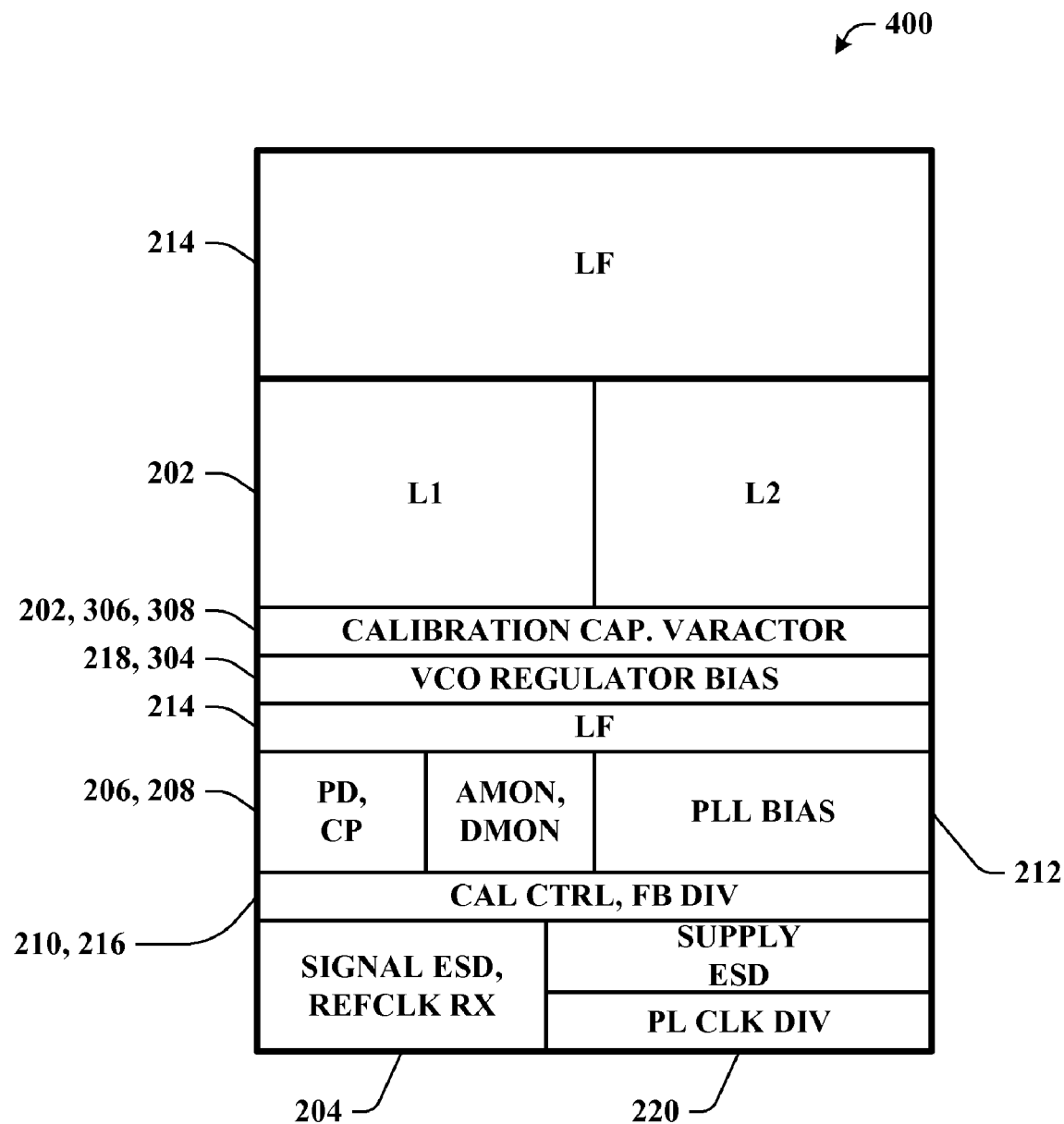
FIG. 4 illustrates an example layout of the phase-locked loop in accordance with an aspect of the subject specification.
Figure 20:
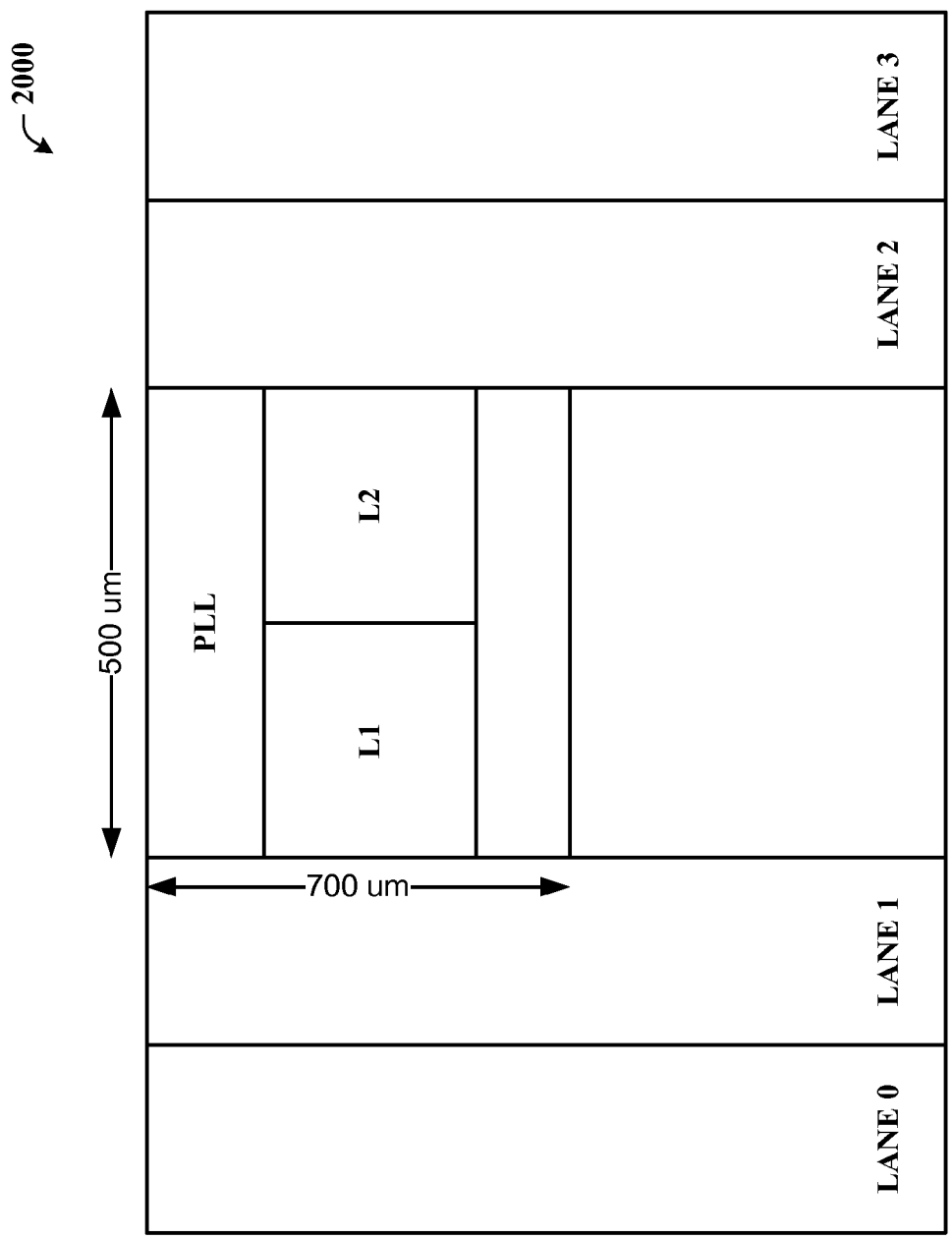
FIG. 20 illustrates a silicon die micrograph for a LC PLL embedded in a 4-lane macro.

FIG. 4 illustrates a silicon layout 400 of an actual embodiment of the phase-locked loop 200 in accordance with an aspect of the subject innovation. Detailed circuit diagrams for the various components of the PLL 200 shown in FIG. 4, including the programmable charge pumps 208, passive loop filter 214, programmable VCO architecture 202, feedback divider 216, per lane clock divider 220, and their sub components are provided below. One of ordinary skill will appreciate that the clock divider 220 illustrated in FIG. 4 can be implemented either on or off the silicon 400. One of ordinary skill in the art will also appreciate that the PLL 200 can include multiple clock dividers 220. FIG. 20 illustrates a silicon die micrograph 2000 for a LC PLL embedded in a 4-lane (lane 0-3) Serializer/Deserializer (SerDes) macro.

Figure 5:
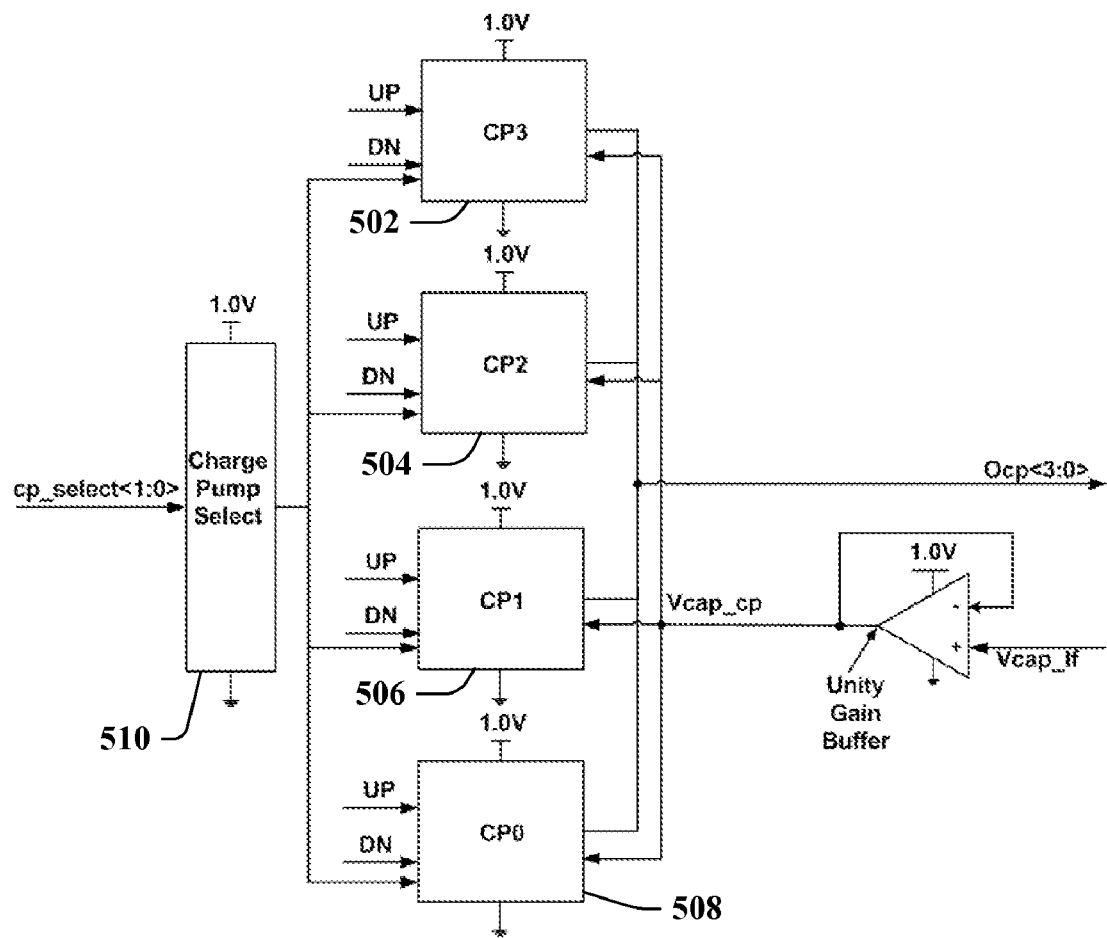
FIG. 5 illustrates an example circuit diagram of a programmable charge pump architecture in accordance with an aspect of the subject specification.

FIG. 5 illustrates an example circuit diagram of a programmable charge pump 208 architecture in accordance with an aspect of the subject innovation. The charge pump 208 includes a first charge pump 502, a second charge pump 504, a third charge pump 506, and a fourth charge pump 508. The charge pumps 502-508 can be activated via a charge pump select 510 (e.g., cp_select<1:0>). The charge pump select 510 includes a first select line 512 (e.g., sel1), and second select line 514 (e.g., sel2). By setting the select lines 512 and/or 514 to a binary zero (0) or one (1) a designer can activate one or more of the charge pumps 502-508. For example, setting the first select line 512 to zero (0) and the second select line 514 to zero (0) can activate the first charge pump 502.

Figure 6:
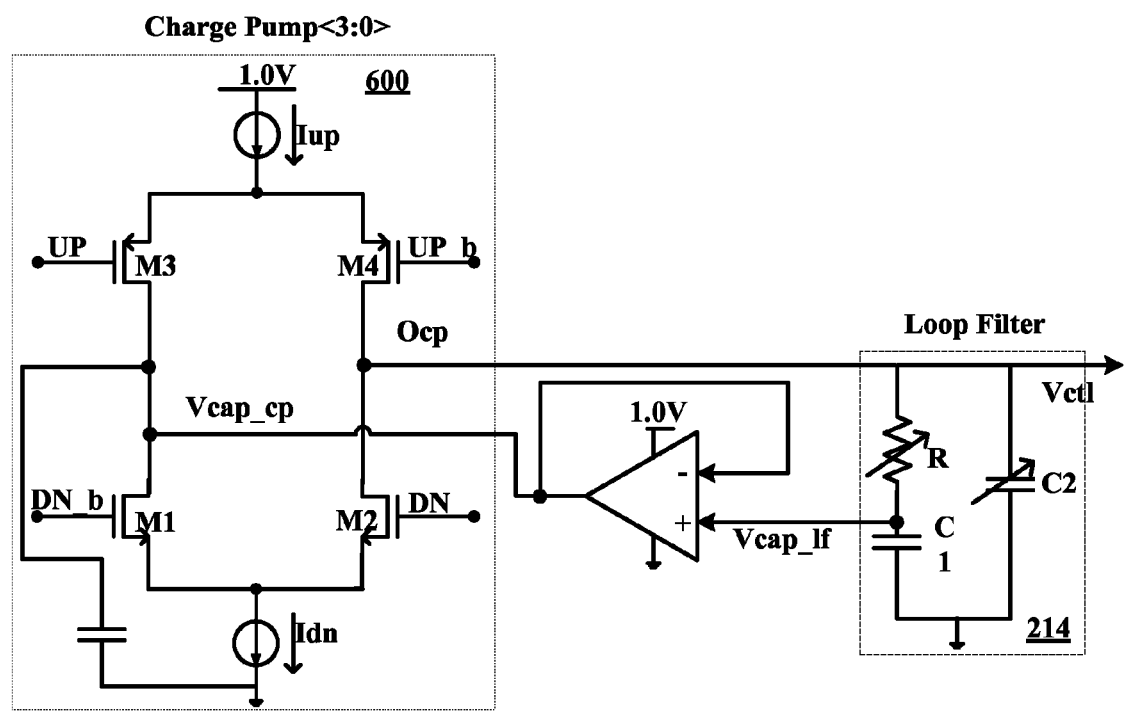
FIG. 6 is an example circuit diagram illustrating the architecture of individual charge pumps in accordance with an aspect of the subject specification.

FIG. 6 illustrates an example circuit diagram illustrating the architecture of an individual charge pump (CP) coupled to the loop filter (LF) 214 in accordance with an aspect of the present innovation. For example, the charge pump 600 can be illustrative of the architecture for any of the charge pumps 502-508 (see FIG. 5). The CP current Ocp is programmable and nominally ranges from 0.25 to 1 mA. The programmable resistance R and ripple capacitance C2 in the LF 214 along with Ocp provide control over loop bandwidth (LBW) and peaking. As shown in FIG. 6, Vcap (voltage across capacitor C1) in the LF is fed back to the drain nodes M1, M3 in the CP through a unity gain buffer. This maintains the voltage across CP current sources to be relatively constant during the phase detector (PD) switching. The feedback path from the loop filter to the charge pump (e.g., Vcap_cp) facilitates reduction of deterministic jitter. The CP, LF output (Vctl) feeds into the VCO 202 as shown in FIG. 3.

Figure 7:
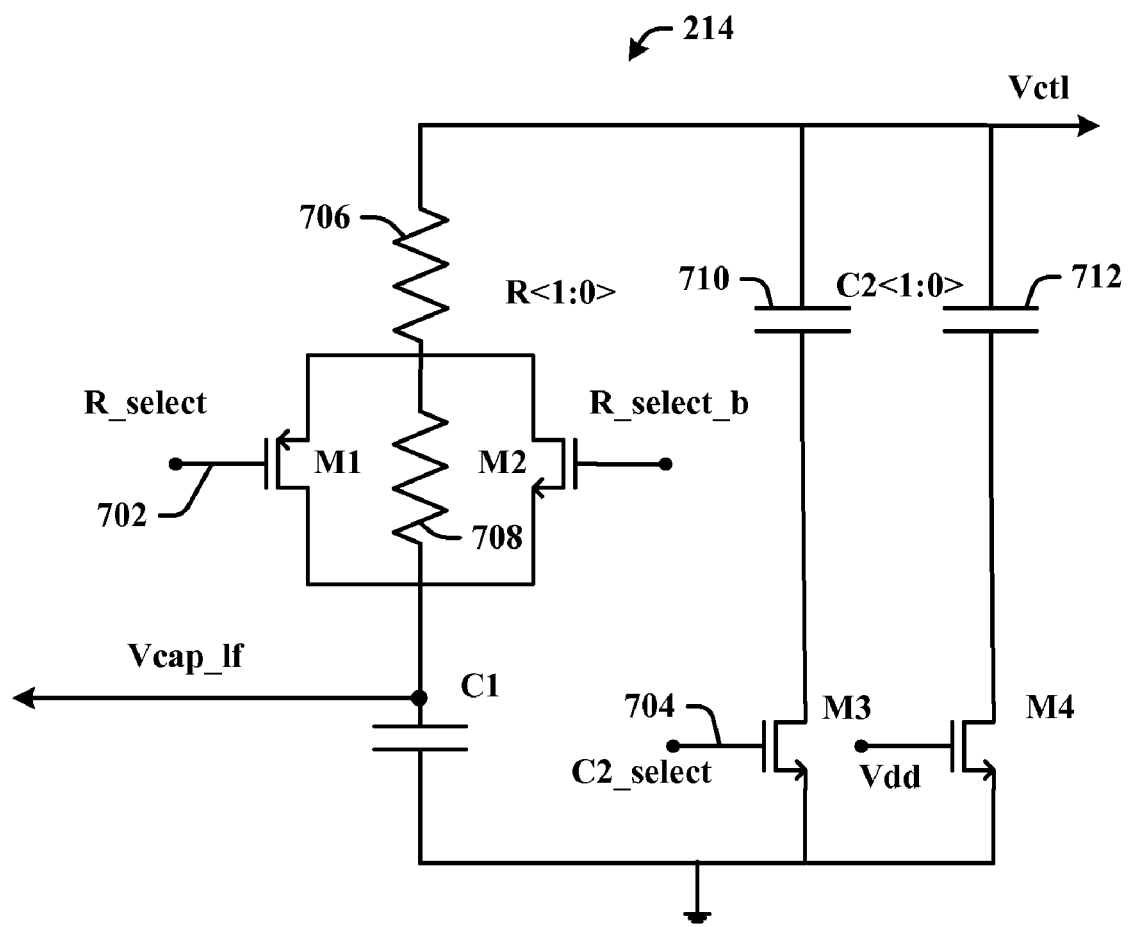
FIG. 7 illustrates an example design of a passive loop filter in accordance with an aspect of the subject specification.

FIG. 7 illustrates an example design of a passive loop filter in accordance with an aspect of the present innovation. The loop filter 214 includes an R select 702 and a C2 select 704 that provide the programmability in the loop filter resistors 706 and 708, and ripple capacitors 710 and 712, respectively. The designer can activate one or both of the filter resistors 706 and 708 via the R select 702. For instance, if R select 702 is set to binary zero (0) then the filter resistor 706 is activate, and if R select 702 is set to a binary one (1) then both filter resistors 706 and 708 are active. Therefore, the resistance in the loop filter 214 can be R or can be two times R. Similarly, the designer can active one or both of the ripple capacitors 710 and 712 via the C2 select 704. Therefore, the capacitance in the loop filter 214 can be C2 or twice C2. The programmability incorporated in the charge pump 208, 600 (discussed previously) and the loop filter 214 enable the loop filter to achieve a LBW range of 1.6 to 9 MHz.

Figure 8:
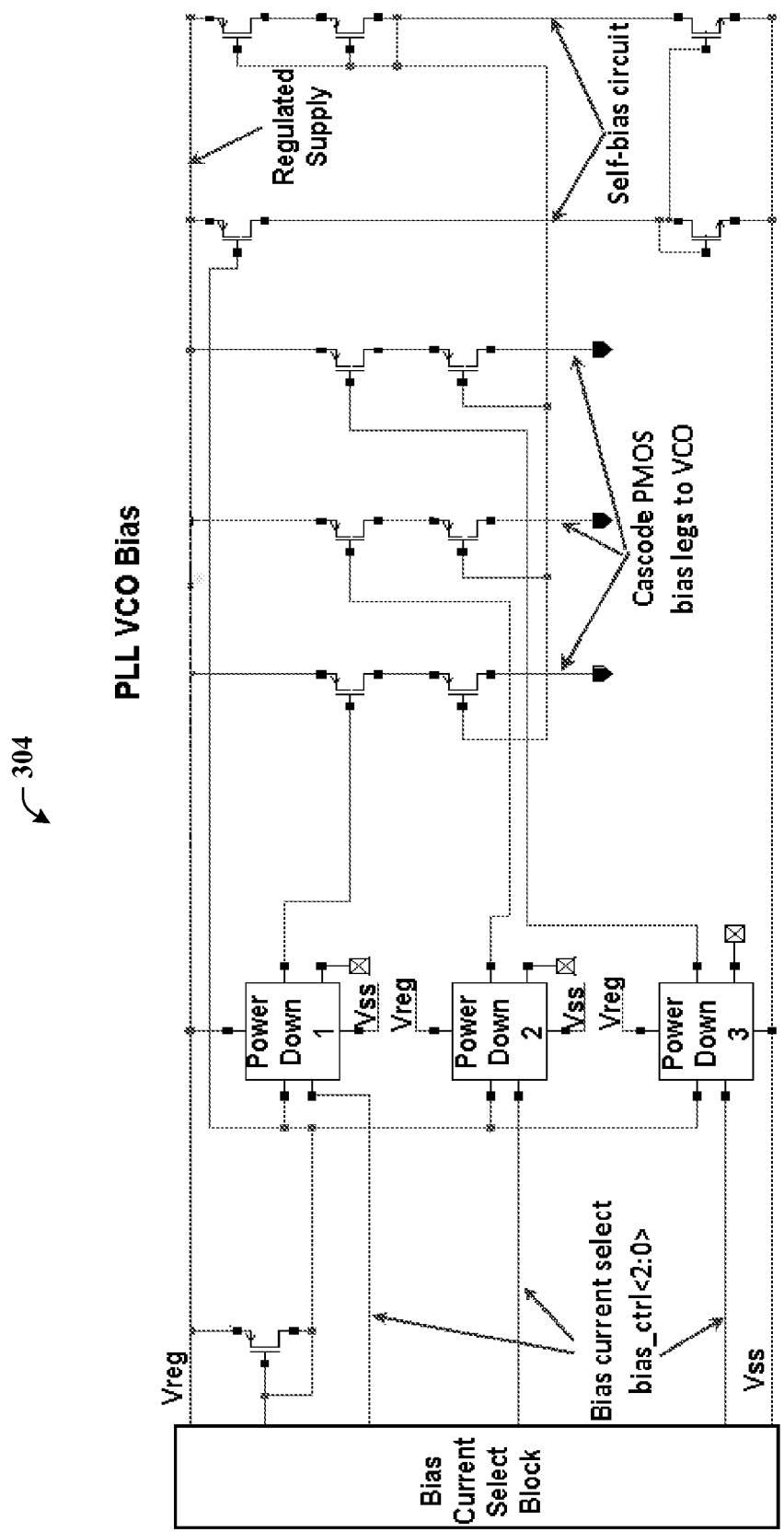
FIG. 8 illustrates an example detailed circuit diagram of a programmable VCO architecture in accordance with an aspect of the subject innovation.

Turning now to FIG. 8, an example detailed circuit diagram illustrating programmable VCO bias current circuit 304 architecture in accordance with an embodiment of the subject innovation is shown. The digital calibration circuit 210 (discussed supra) selects the VCO bias current for every calibration code so as to maximize output amplitude without pushing the LC tank 214 into the voltage-limited region. This scheme optimizes the VCO 202 phase noise across its frequency range and is made programmable to compensate for future process shifts.

Figure 9:
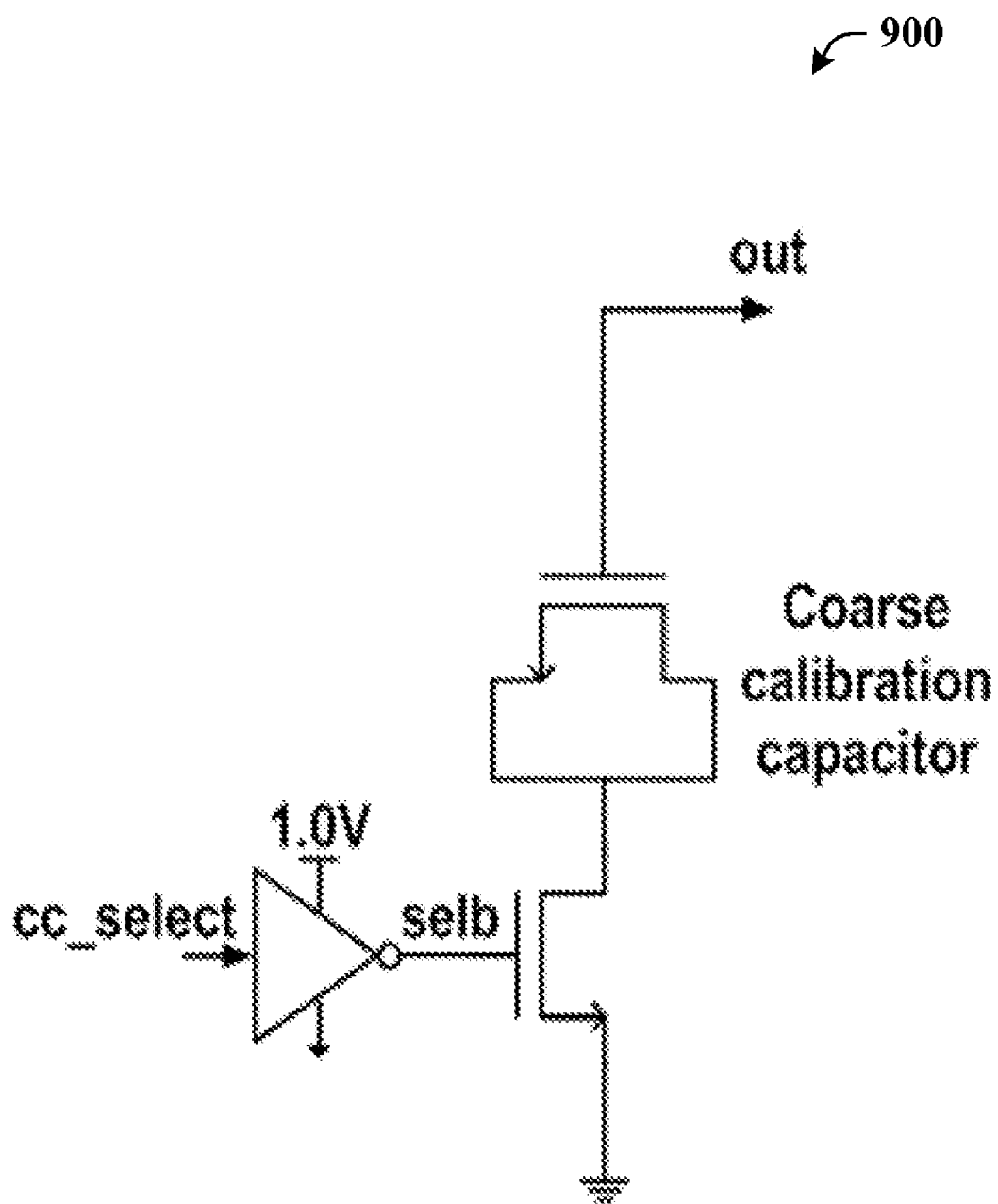
FIG. 9 illustrates an example coarse calibration circuit unit cell in accordance with an aspect of the subject specification.

FIG. 9 illustrates an example coarse calibration circuit unit cell 900 in accordance with an aspect of the subject innovation. Each coarse calibration block includes 32 digitally switchable 1.0V NMOS in Nwell accumulation-mode MOS capacitors with NMOS switches controlled by the digital auto-calibration circuit (see FIG. 10). On start-up, all of the coarse calibration capacitors can be selected. The coarse calibration circuit provides the wide coarse tuning range of 2.3 to 4.6 GHz, after which, fine tuning occurs.

Figure 10:
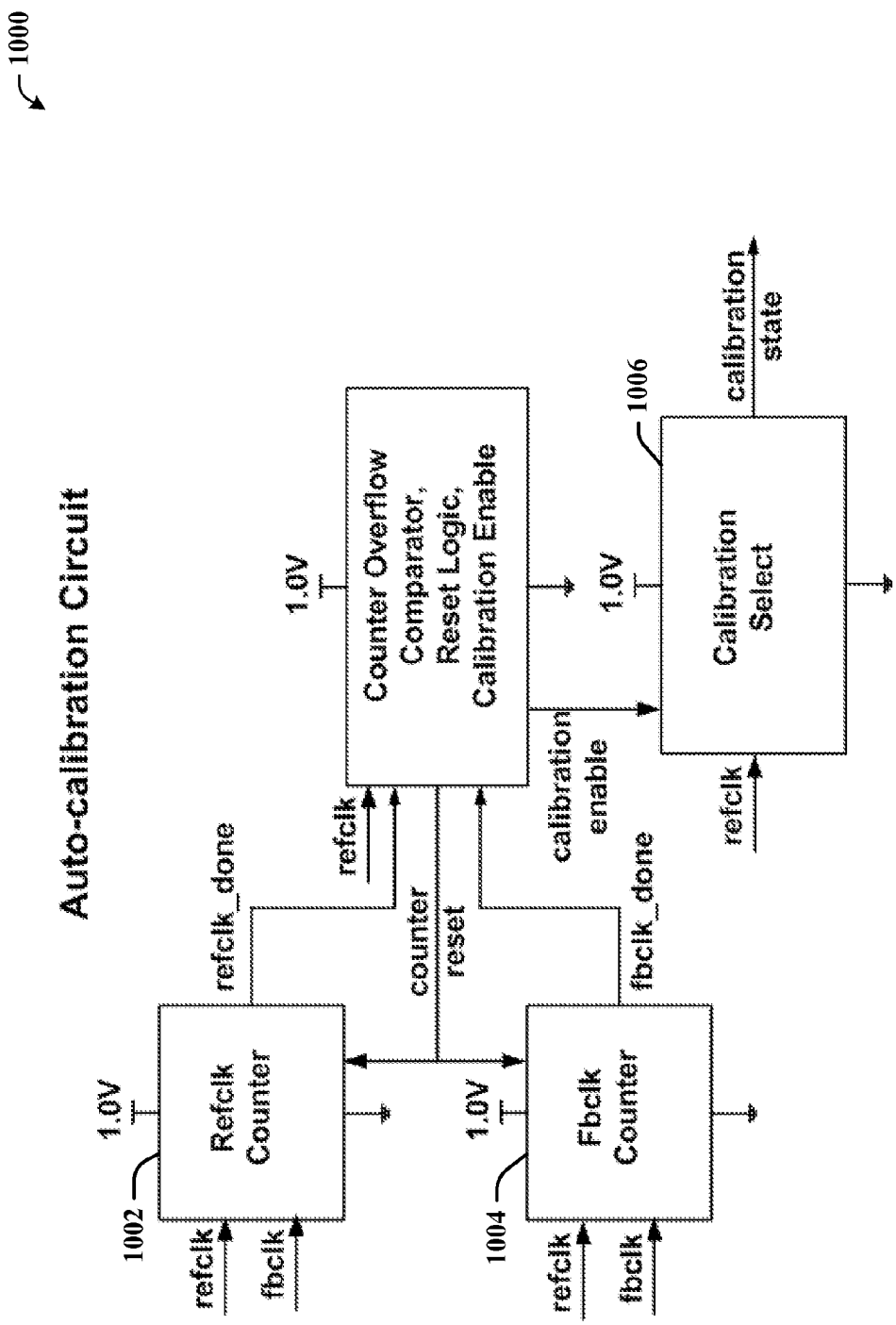
FIG. 10 illustrates an example circuit diagram of an auto-calibration circuit in accordance with an aspect of the subject specification.

Illustrated in FIG. 10 is an example circuit diagram showing an auto-calibration circuit in accordance with an aspect of the subject innovation. The auto-calibration circuit 1000 includes two counters, one that is clocked by the reference clock 1002 (e.g., reflck counter) and the other by the feedback clock 1004 (e.g., feedback clock counter). The maximum count value on these counters is programmable to $2^8$, $2^{10}$, $2^{12}$, or $2^{14}$. If the reference clock counter 1002 reaches the maximum count before the feedback clock counter 1004, the calibration select circuit 1006 de-selects a coarse calibration capacitor from the LC tank and the counter process is restarted. This process repeats until the feedback clock counter 1004 reaches its maximum count before the reference clock counter 1002. Subsequently, fine tuning occurs. It is to be appreciated FIG. 10 illustrates but a single example, and the auto-calibration circuit could alternatively be implemented in hardware, software, FPGA, and so forth.

Figure 11:
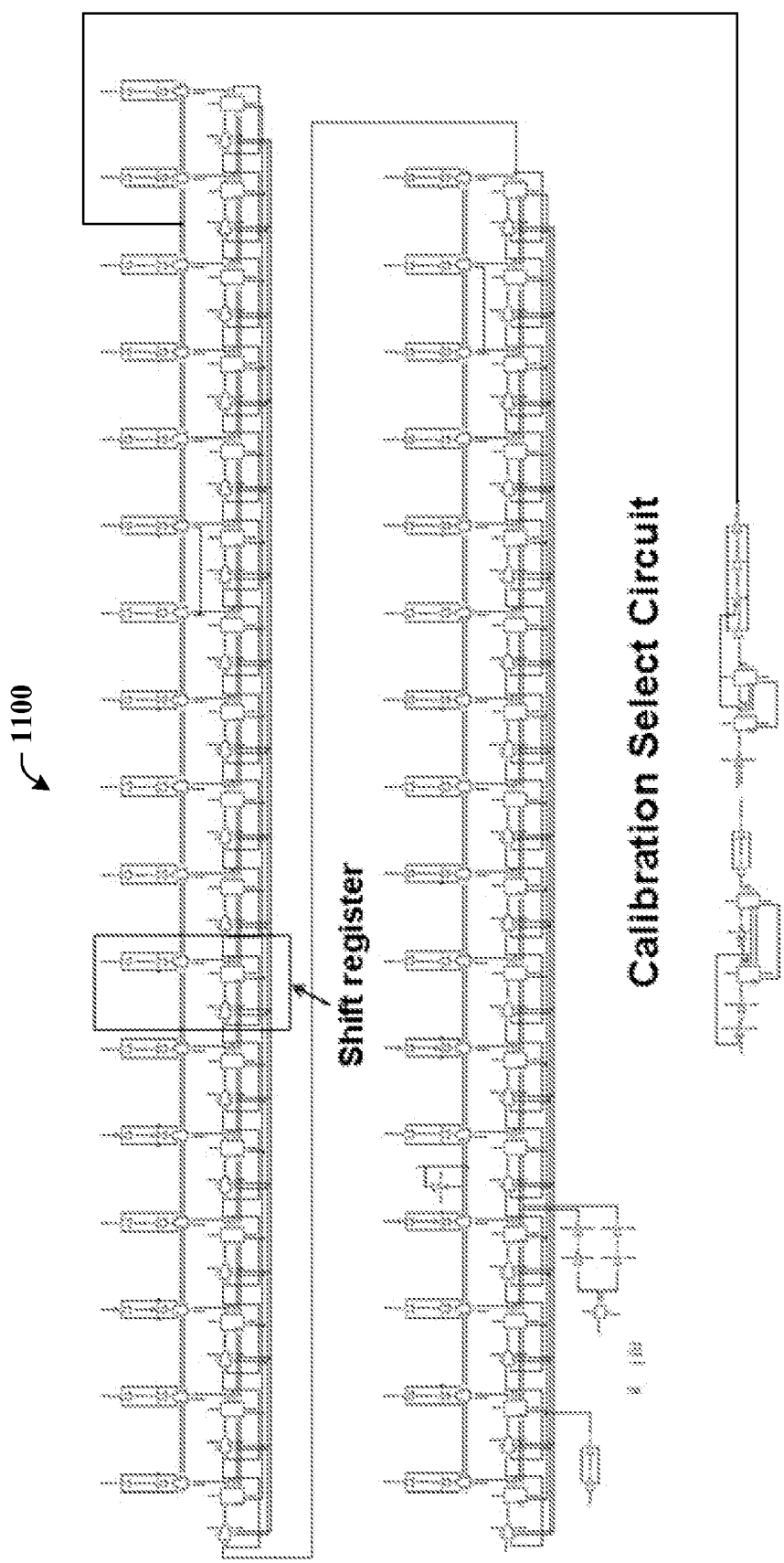
FIG. 11 illustrates an example circuit diagram of a calibration select circuit in accordance with an aspect of the subject specification.

Referring to FIG. 11, an example circuit diagram illustrating a calibration select circuit 1100 is shown in accordance with an aspect of the current innovation. The calibration select circuit 1100 consists of shift registers and control logic that is clocked by the reference clock.

Figure 12:
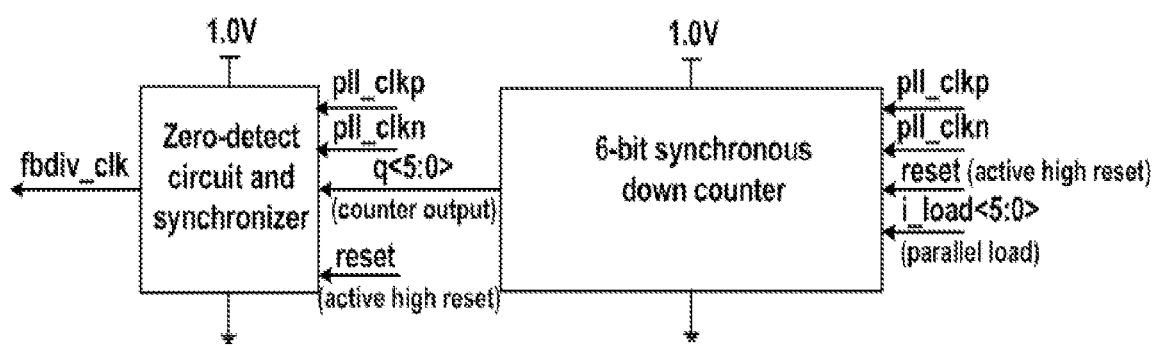
FIG. 12 illustrates an example top level diagram of a feedback clock divider in accordance with an aspect of the subject specification.

FIG. 12 illustrates an example top level diagram of a feedback divider 216 in accordance with an aspect of the current innovation. The feedback divider 216 is comprised of completely static CMOS using toggle flops, and designed for low power/high speed operation. In addition, the feedback divider 216 is programmable, and can divide a feedback signal (e.g., VCO output) by N, wherein N is an integer between two (2) and sixty four (64) inclusive.

Figure 13:
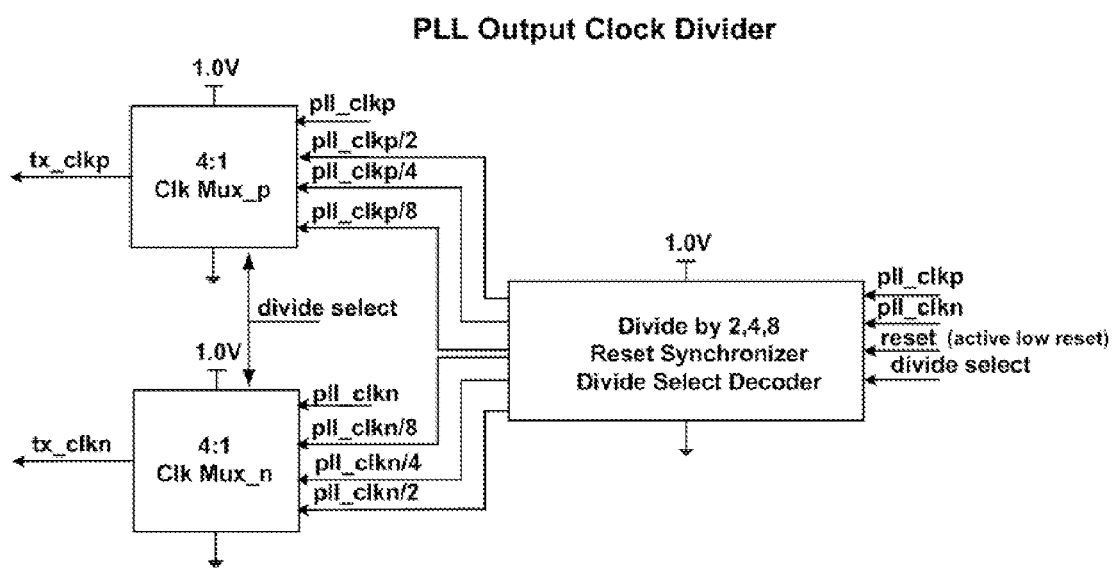
FIG. 13 illustrates an example top level diagram of a per lane clock divider in accordance with an aspect of the subject specification.

FIG. 13 illustrates an example top level diagram of a per lane clock divider 220 in accordance with an aspect of the current innovation. The per lane clock divider 220 is a programmable clock divider that can be implemented at the transmission (e.g., Tx) input of each lane to divide the frequency of the output signal of the LC VCO 202 by an Integer M, wherein M can be one (1), two (2), four (4), or eight (8). As discussed previously, the per lane clock divider 220 is controlled by the calibration control block 210. In the preferred embodiment, the clock divider 220 can be programmed to provide a lane with a data transfer rate between 0.586 Gb/s to 10 Gb/s. Specifically, a programmable PLL output clock divide of 8 with PLL locked at 2.343 GHz enables 0.586 Gb/s; output clock divide of I with PLL locked at 5 GHz enables 10 Gb/s. The data transfer rate for each lane can be set independently of the data rates of the other lanes or in relation to the data rates of the other lanes.

Actual Test Results

The following FIGS. 14-19 are illustrative of test conducted by the inventors for the innovation described in the preceding figures (e.g., FIGS. 2-13). The test results demonstrate that the innovation operates as asserted herein, and that the innovation has actually been reduced to practice. It is to be appreciated, that these test results are for but one example embodiment, and a plurality of other possible tests and results are possible within the scope and spirit of the subject innovation.

Figure 14:
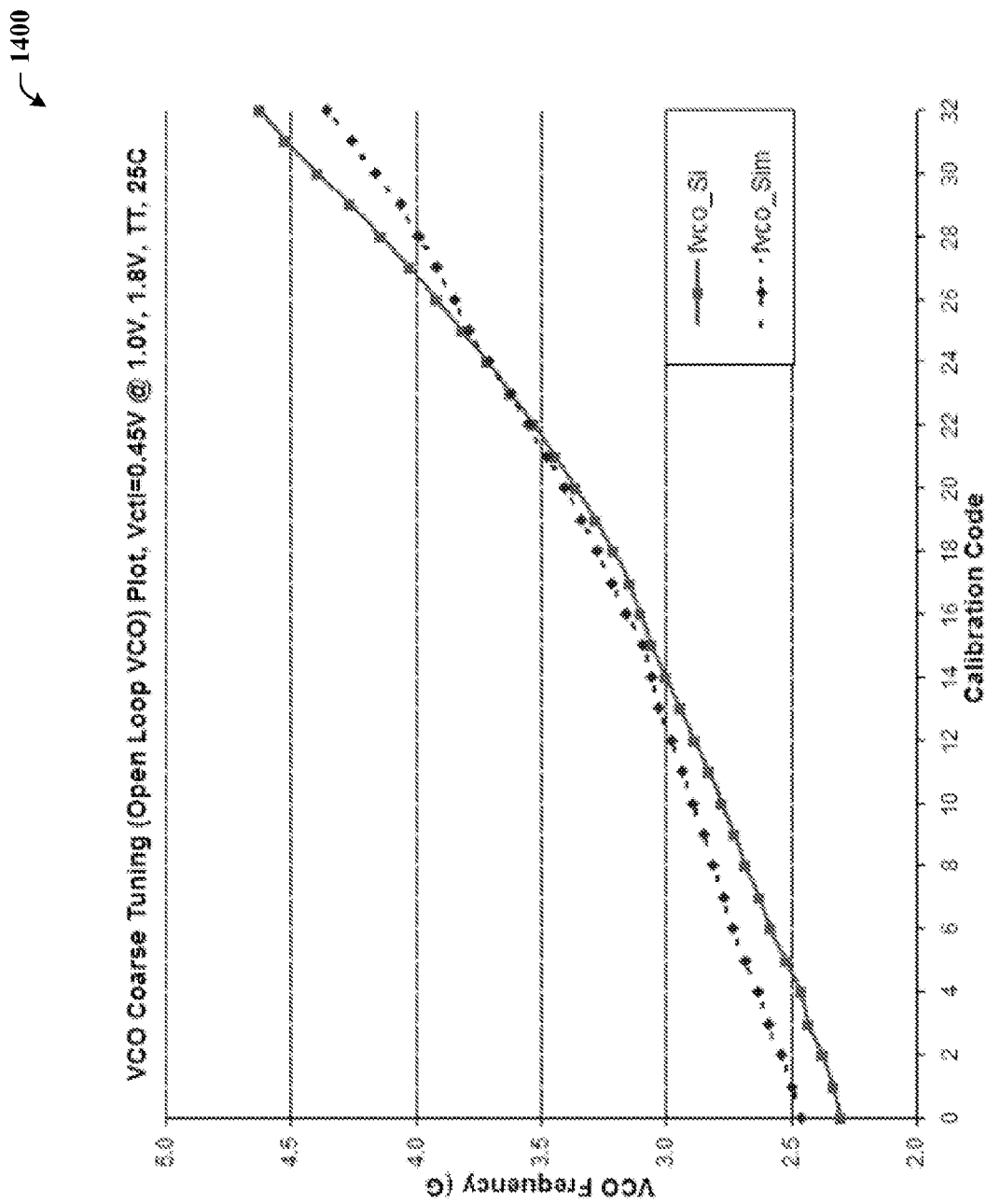
FIG. 14 is an example graphical representation of the VCO frequency vs. calibration code measurements in accordance with an aspect of the subject specification.

FIG. 14 illustrates a plot 1400 of the open loop VCO output frequency measurement in Ghz (Y-axis) versus the calibration code measurements (X-axis) (i.e. number of capacitors selected) for silicon (fvco_Si) and simulation tuned for inline device characteristics and parasitic extraction (fvco_Sim). As can been seen, the silicon measurements closely track the simulation measurements.

Figure 15:
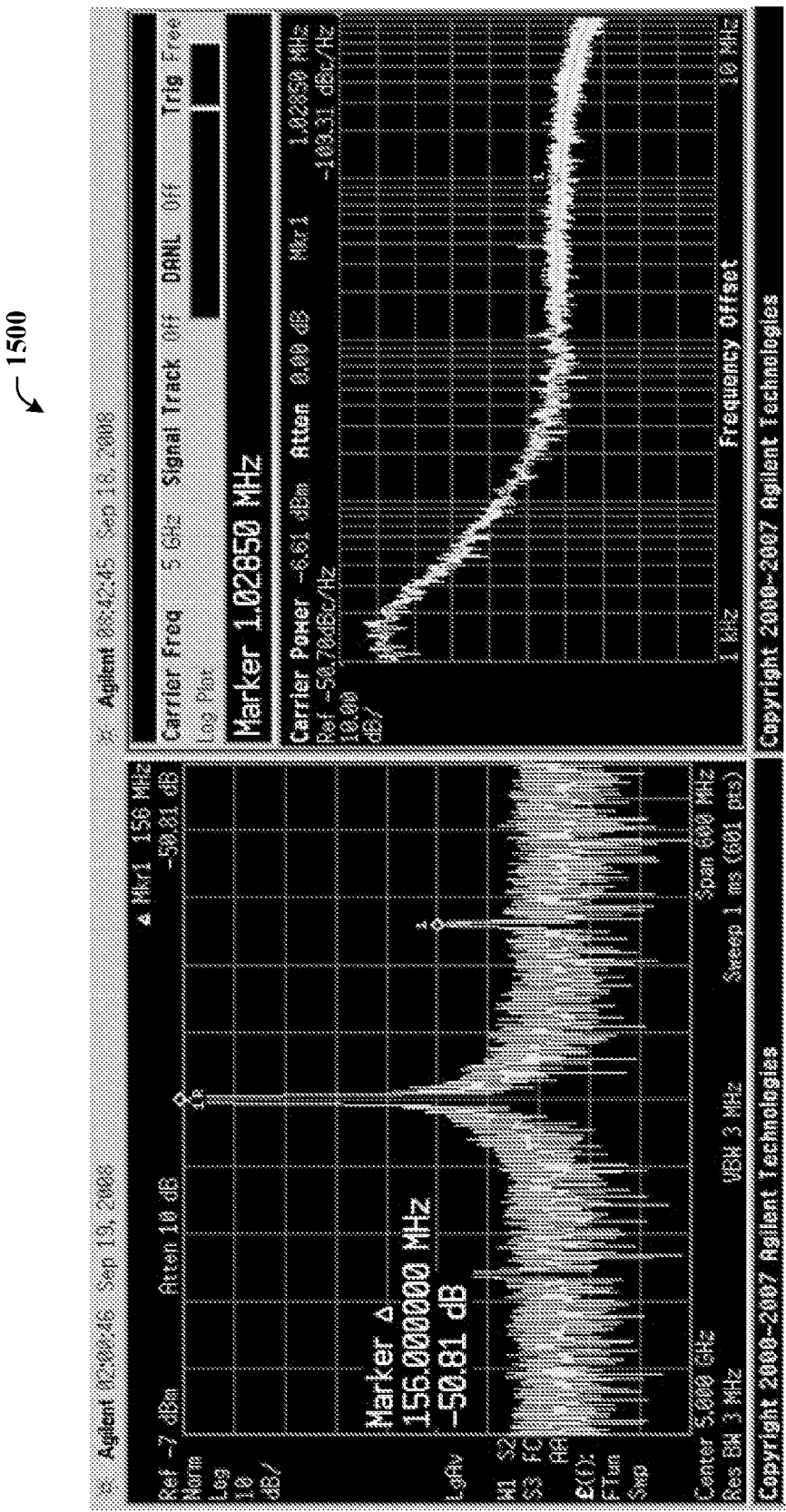
FIG. 15 is an example graphical representation of the measured closed loop frequency spectrum of the phase-locked loop in accordance with the subject specification.

FIG. 15 shows a spectrum analyzer screenshot 1500 illustrating the closed loop frequency spectrum of the PLL locked at 5 GHz (10 Gb/s) with a clock pattern coming out on the TX. Reference spurs are observed at Δf=±156 MHz with a relative power of −50.81 dB with regard to the carrier. With the PLL locked at 5 GHz, closed loop phase noise at 1 MHz offset is measured to be −109.31 dBc/Hz. The test was conducted using an Agilent® E4440A 3 Hz-26.5 GHz PSA Series Spectrum Analyzer.

Figure 16:
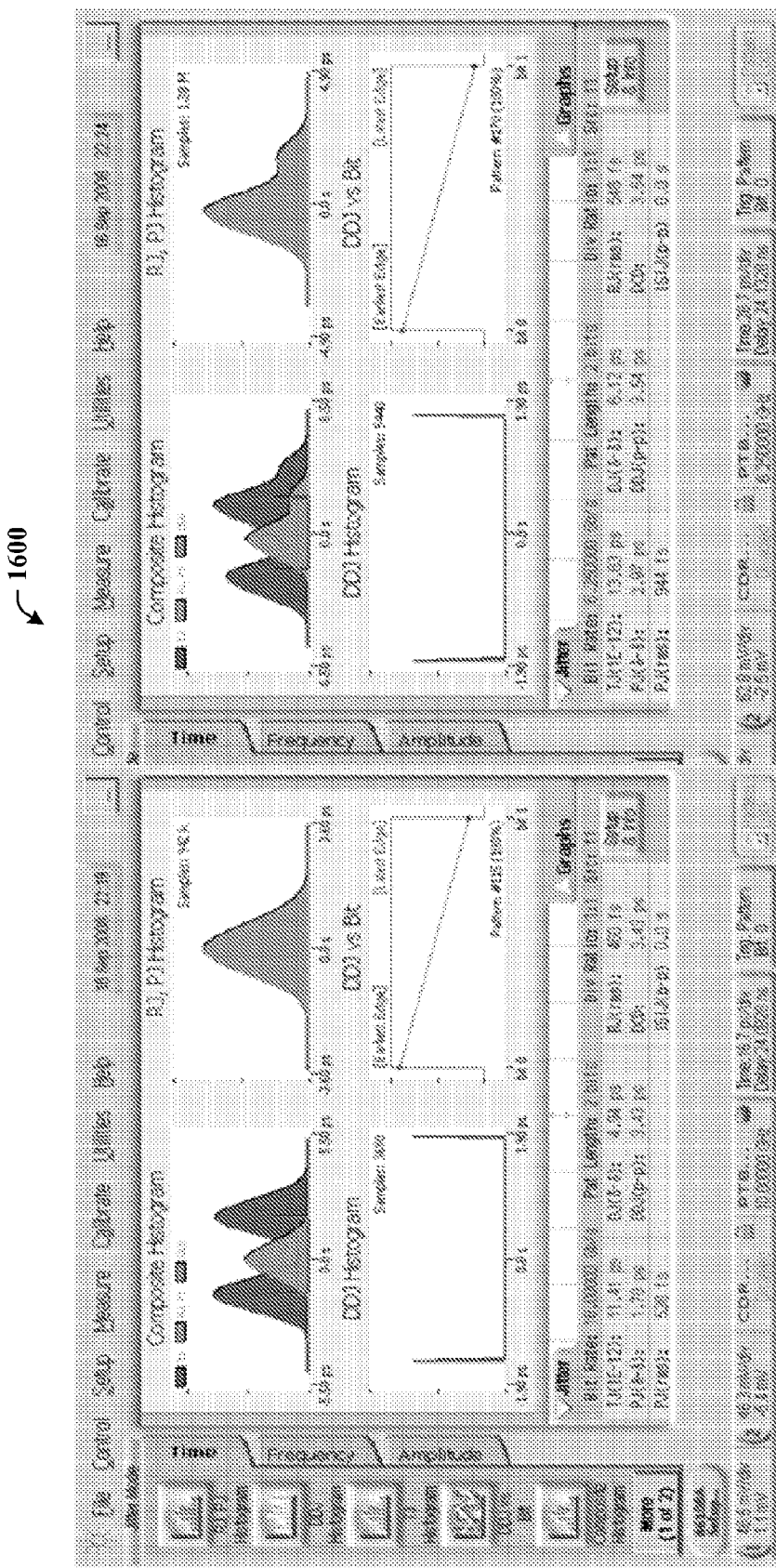
FIG. 16 is an example graphical representation of a set of jitter measurements of the phase-locked loop in accordance with an aspect of the subject specification.

FIG. 16 shows a screenshot 1600 illustrating jitter measurements of a PLL disclosed in accordance with the current innovation. The PLL is shown operating at 5 GHz (10 Gb/s) and 3.125 GHz (6.25 Gb/s), with a clock pattern generated from the transmission line (Tx). The $RJ_{rms}$ equals 460 fs at 5 GHz, and 548 fs at 3.125 GHz. The clock and data recovery (CDR) is disabled and an external reference clock (e.g., 156.25 MHz) is used as a trigger through the precision time base (PTB) input. The results were obtained via an Agilent® 86100C DCA-J sampling oscilloscope with an Agilent® 86108A precision waveform analyzer module.

Figure 17:
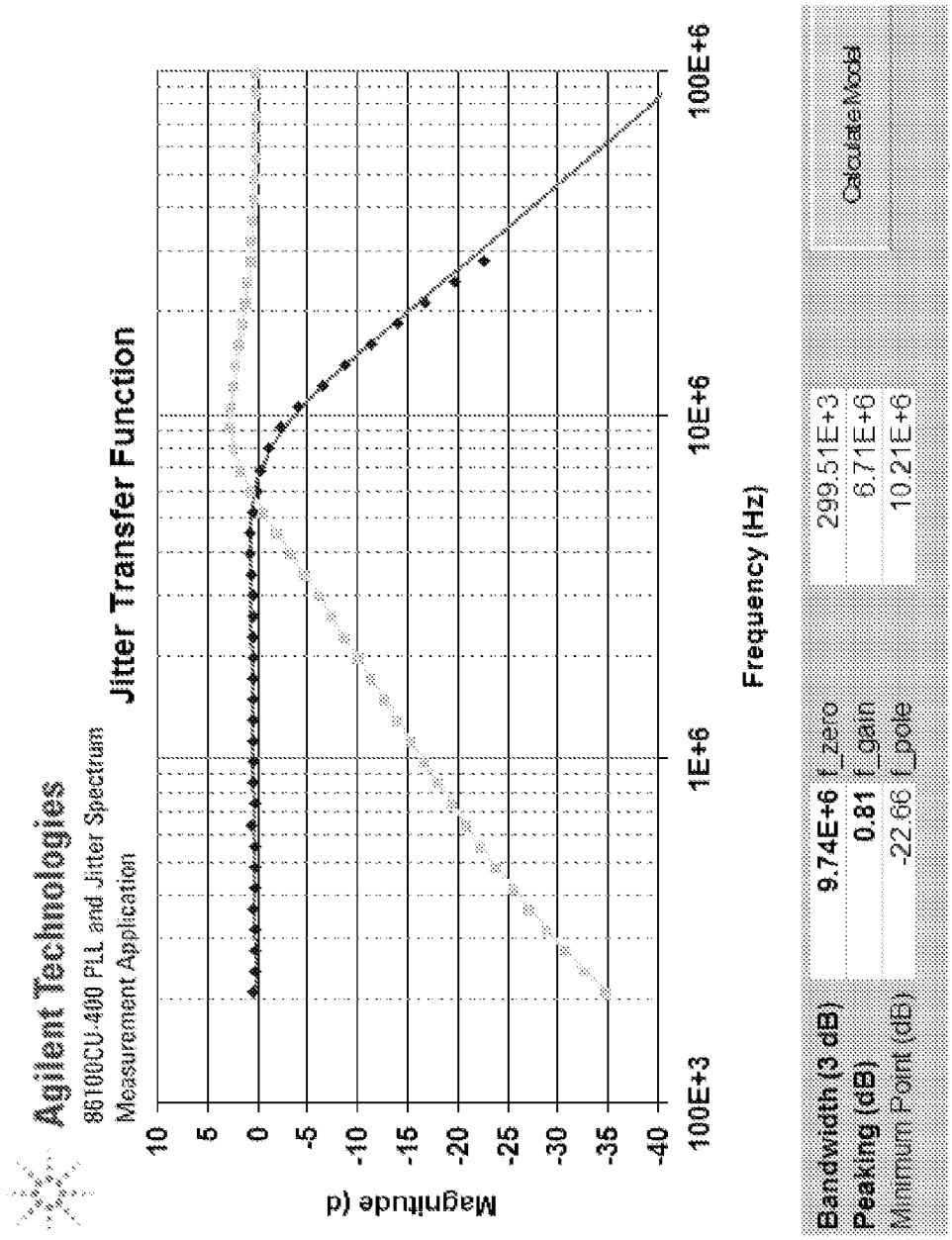
FIG. 17 is an example graphical representation of a jitter plot in accordance with an aspect of the subject specification.

FIG. 17 is a jitter transfer plot 1700 of a phase-locked loop at 3.125 GHz in accordance with an aspect of the current innovation. As shown on the plot, the PLL loop bandwidth (LBW) at maximum setting was measured to be 9.74 MHz with 0.81 dB of peaking. The test were performed using an Agilent 86100C DCA-J sampling oscilloscope with 86108A precision waveform analyzer module, and an Agilent® 86100CU-400 PLL and jitter spectrum measurement application.

Figure 18:
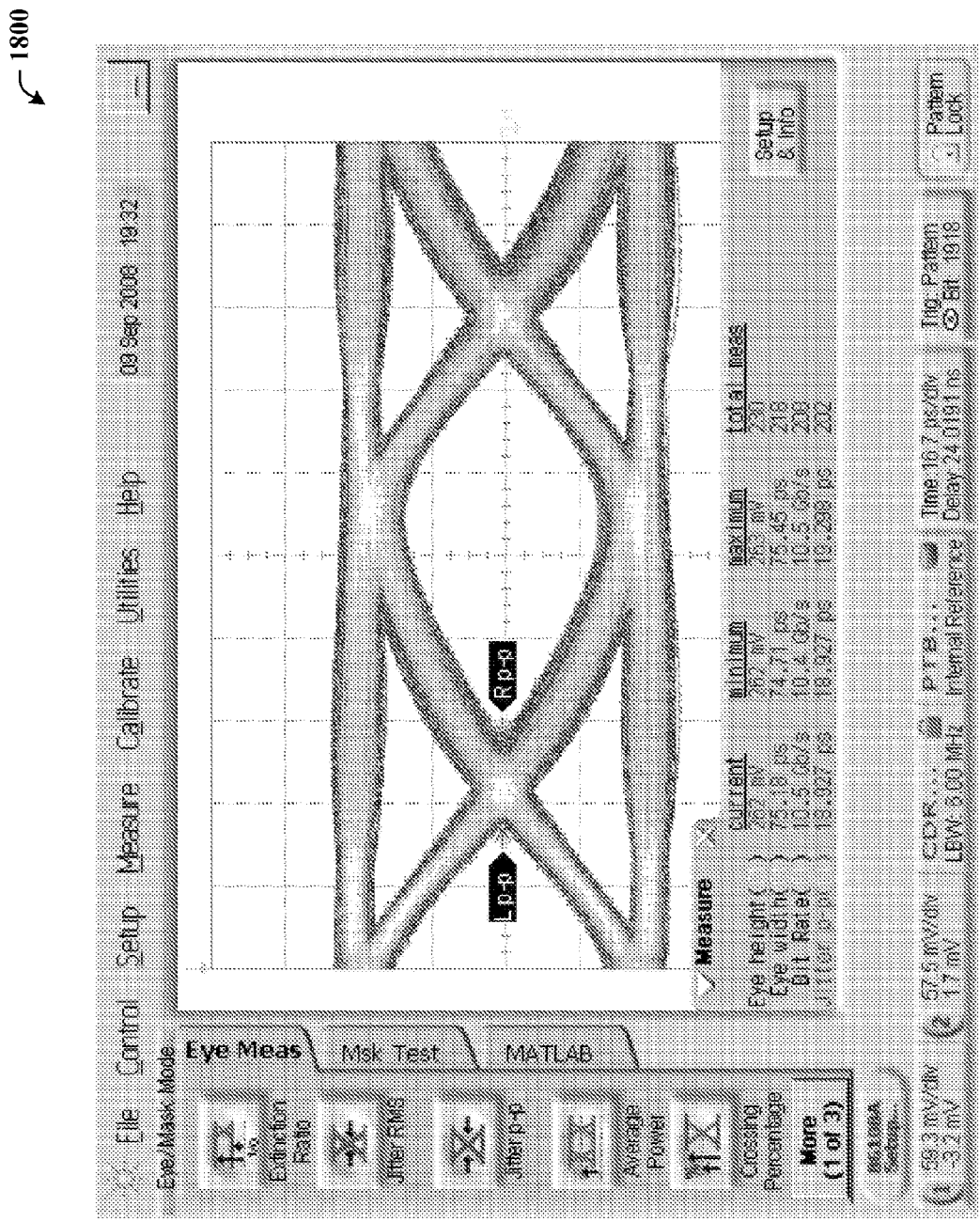
FIG. 18 is an example graphical representation of a plot of the transmission eye in accordance with an aspect of the subject specification.

FIG. 18 is a screenshot 1800 illustrating a transmission (Tx) eye at 10 Gb/s with a PRBS11 pattern. PBRS11 refers to Pseudo Random Binary Sequence with a length of 2047 bits. The clock and data recovery (CDR) loop bandwidth (LBW) is set to 6 MHz (rate/1667) and precision time base (PTB) is enabled. The horizontal axis represents time and the vertical axis represents the Tx signal voltage. The Tx eye consists of a maximum Tx signal voltage of 262 mv and has a duration of 74.71 ps. The screenshot was captured from an Agilent® 86100C DCA-J sampling oscilloscope with an Agilent® 86108A precision waveform analyzer module.

Figure 19:
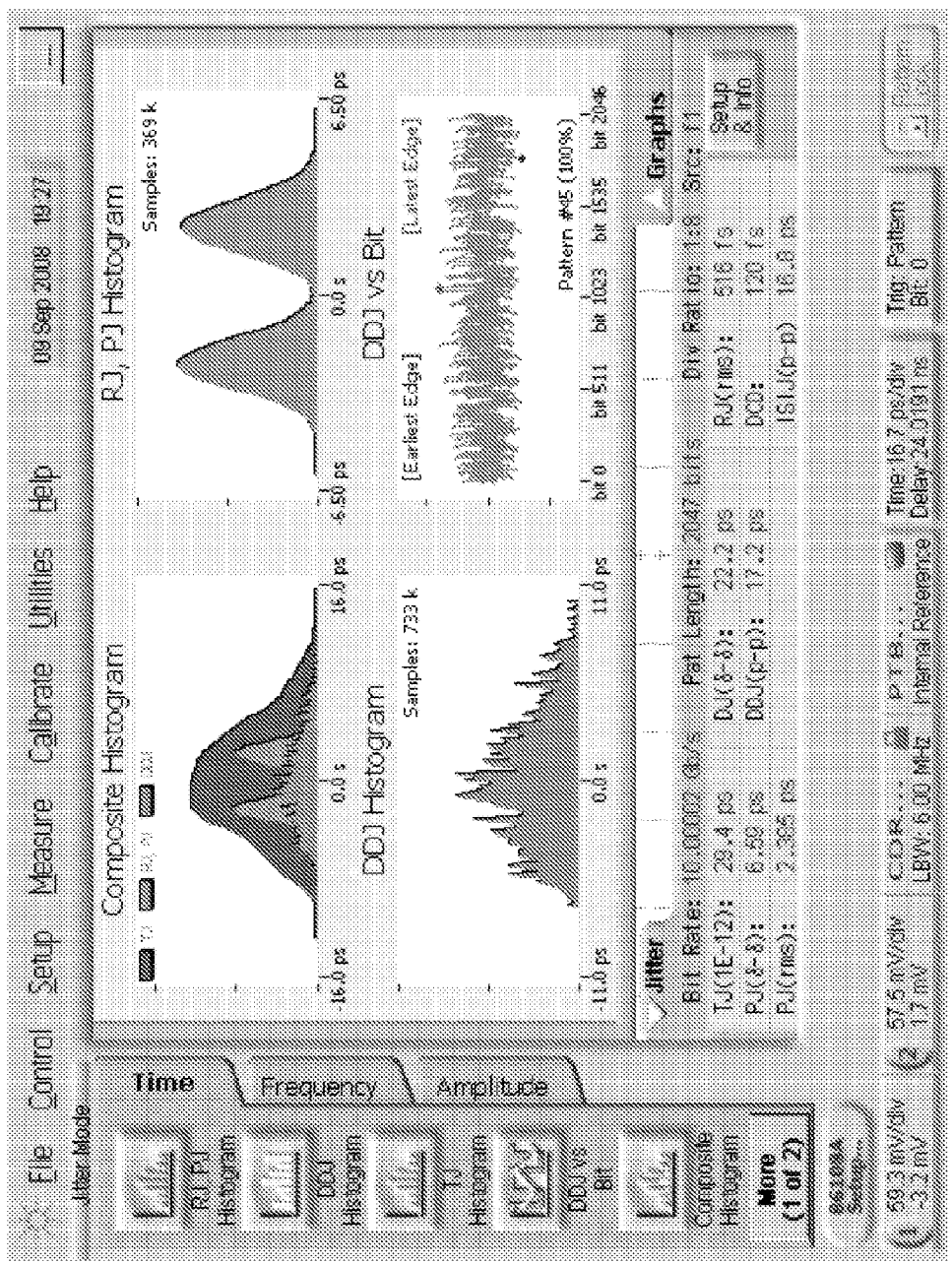
FIG. 19 is an example graphical representation of a plot of the transmission jitter in accordance with an aspect of the subject specification.

FIG. 19 is a screenshot 1900 illustrating transmission (Tx) jitter at 10 Gb/s with a PRBS11 pattern. The clock and delay and recovery (CDR) loop bandwidth (LBW) was set to 6 MHz (rate/1667), and the precision time base (PTB) was enabled. The $RJ_{rms}$ was measure to be 516 fs at 10 Gb/s. The results were obtained using an Agilent® 86100C DCA-J sampling oscilloscope with an Agilent® 86108A precision waveform analyzer module.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A LC-based phase-locked loop circuit, comprising:
    a charge pump coupled to receive an error signal that is proportional to a phase difference between a reference clock and a feedback clock, wherein the charge pump generates an output signal in response to the error signal, wherein the charge pump comprises a capacitor;
    a loop filter that removes high frequency components above a predetermined threshold from the output signal, thereby creating a voltage control signal, wherein the loop filter comprises:
        an adjustable capacitor coupled between an output of the charge pump and a voltage supply terminal;
        an adjustable resistor coupled between the output of the charge pump and a first node; and
        a fixed capacitor coupled between the first node and the voltage supply terminal;
    a feedback loop that provides a feedback voltage from the loop filter to the charge pump, wherein the feedback loop comprises a buffer having an input coupled to the first node and an output connected to the capacitor of the charge pump, wherein the feedback voltage reduces jitter in the phase-locked loop circuit; and
    a voltage controlled oscillator that generates a clock signal having a frequency based on the voltage control signal.

2. The circuit of claim 1, wherein the loop filter comprises only passive circuit elements.

3. The circuit of claim 1, wherein the charge pump comprises:
    a first transistor that couples a first node to a first current source;
    a second transistor that couples the first node to a second current source, wherein the feedback loop provides the feedback voltage to the first node.

4. The circuit of claim 3, wherein the charge pump further comprises a capacitor connected to the first node.

5. The circuit of claim 1, wherein the charge pump comprises current sources, wherein the feedback voltage maintains a constant voltage across the current sources.

6. The circuit of claim 1, wherein the charge pump includes a plurality of selectable charge pump circuits.

7. The circuit of claim 1, wherein the voltage controlled oscillator comprises an LC tank circuit.

8. The circuit of claim 7, further comprising an auto-calibration component that generates a configuration code in response to the reference clock signal and the feedback clock signal, wherein the configuration code activates a set of calibration capacitors in the LC tank circuit.

9. The circuit of claim 8, wherein the auto-calibration component initially activates all calibration capacitors in the LC tank circuit, compares the reference clock signal with the feedback clock signal, and then de-activates one or more calibration capacitors of the LC tank circuit if the reference clock signal has a higher frequency than the feedback clock signal.

10. The circuit of claim 8, further comprising a bias circuit that supplies a bias current to the LC tank circuit, wherein the bias circuit adjusts the bias current in response to the configuration code.

\* \* \* \* \*